United States Patent

Roth

[11] Patent Number: 5,847,615
[45] Date of Patent: Dec. 8, 1998

[54] FREQUENCY SYNTHESIZER OPERATING ACCORDING TO THE PRINCIPLE OF FRACTIONAL FREQUENCY SYNTHESIS

[75] Inventor: Alexander Roth, Dorfen, Germany

[73] Assignee: Rohde & Schwarz GmbH & Co. KG, Munich, Germany

[21] Appl. No.: 948,587

[22] Filed: Oct. 10, 1997

[30] Foreign Application Priority Data

Nov. 16, 1996 [DE] Germany .................. 196 47 474.4

[51] Int. Cl.$^6$ .................. H03L 7/06; H03L 7/18
[52] U.S. Cl. .................. 331/16; 331/18; 331/25; 327/105; 327/156
[58] Field of Search .................. 331/1 A, 16, 18, 331/25; 327/105, 156–159

[56] References Cited

U.S. PATENT DOCUMENTS

| | | | |
|---|---|---|---|
| 3,976,945 | 8/1976 | Cox | 328/14 |
| 4,234,929 | 11/1980 | Riley, Jr. | 364/701 |
| 4,584,539 | 4/1986 | Stankey | 331/16 |
| 4,609,881 | 9/1986 | Wells | 331/1 A |
| 5,146,186 | 9/1992 | Vella | 331/16 |

FOREIGN PATENT DOCUMENTS

| | | |
|---|---|---|
| 0 125 790 B2 | 11/1984 | European Pat. Off. . |
| 0 214 217 B1 | 3/1987 | European Pat. Off. . |

*Primary Examiner*—David Mis
*Attorney, Agent, or Firm*—Hill & Simpson

[57] ABSTRACT

A frequency synthesizer operating according to fractional frequency synthesis, has a phase-controlled oscillator, a phase detector that controls this oscillator, a loop filter arranged in a control line between the phase detector and the oscillator, a reference frequency source and a frequency divider arranged between this reference frequency source and one input of the phase detector, which frequency divider can be adjusted to whole-number division ratios. The frequency synthesizer also has an adjustment device that operates with multiple integration, by which the whole-number division ratio of the frequency divider is controlled such that a fractional division ratio corresponding to a desired fractional rational division ratio is simulated. The other input of the phase detector is connected with the output of the oscillator via a mixer, wherein a difference is formed of the output frequency of the oscillator and the reference frequency of the reference frequency source.

5 Claims, 1 Drawing Sheet

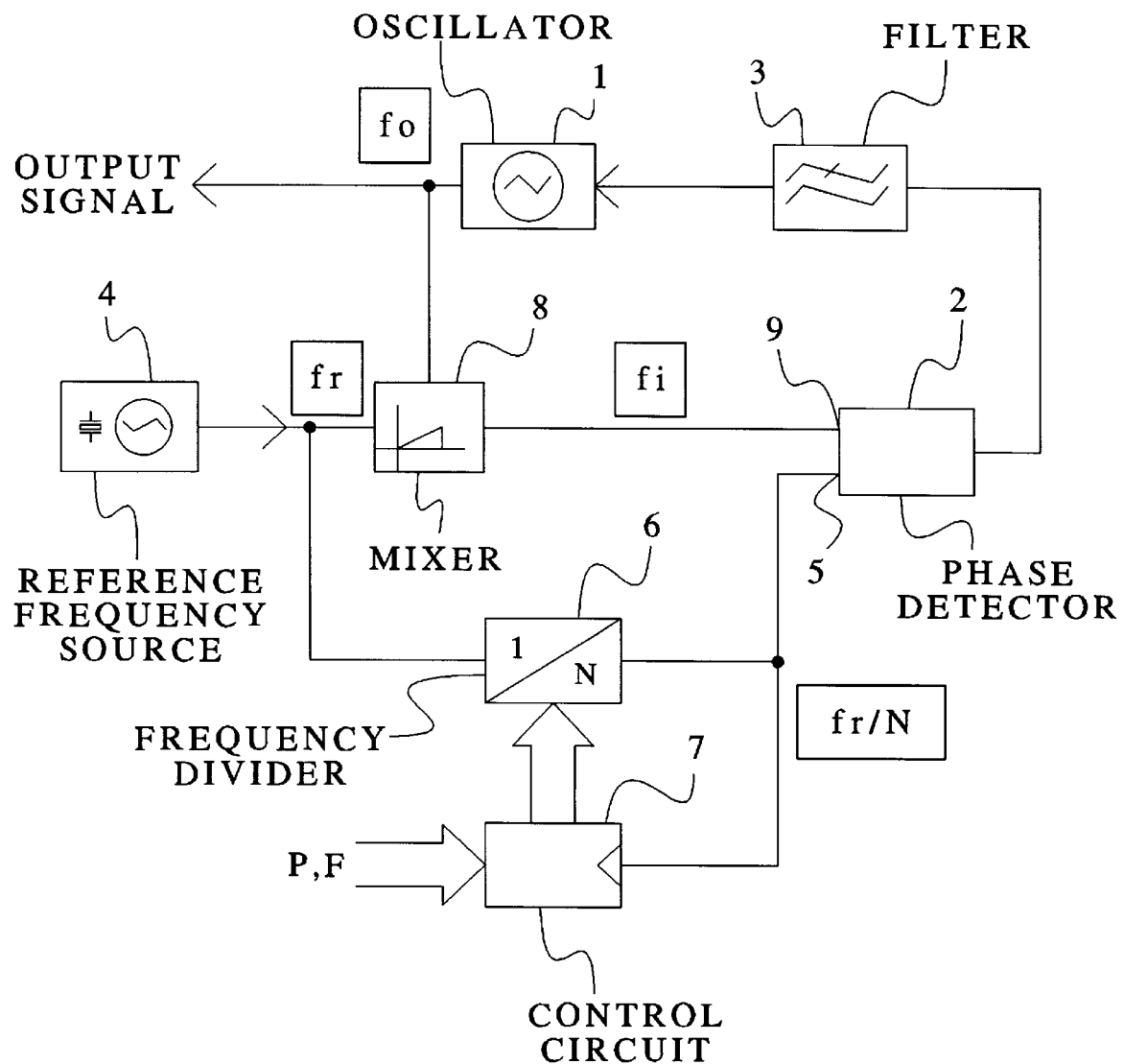

FREQUENCY SYNTHESIZER OPERATING ACCORDING TO THE PRINCIPLE OF FRACTIONAL FREQUENCY SYNTHESIS

BACKGROUND OF THE INVENTION

The invention relates to and is based on a frequency synthesizer operating according to the principle of fractional frequency synthesis.

In the most common type of prior art fractional frequency synthesis, the frequency divider, whose whole-number division ratio is switched such that a fractional division ratio corresponding to a fractional digit portion of the desired division ratio is simulated, is arranged in the control loop between the phase-controlled oscillator and the phase detector (for example, see European reference EP 0 125 719 or 0 214 217). Although this arrangement meets the respective requirements for the desired frequency range of the output frequency and the setting tolerance thereof, it has the disadvantage that the phase noise of the reference frequency is worsened by the division factor. Moreover, spectral secondary lines occur in the output signal if the mean division factor lies in the vicinity of whole-number division factors. These secondary lines arise due to the fact that the harmonics of the reference frequency have only a finite isolation from the output signal.

It is known in the prior art to arrange the fractional frequency divider between the reference frequency and the phase detector (U.S. Pat. No. 3,976, 945). The disadvantage of the worsened phase noise and the occurrence of secondary lines can be avoided, but this known arrangement has the disadvantage that the reference frequency multiplied by the division factor has to be higher than the desired output frequency. It would thereby have to lie in the GHz region for an output oscillator operated in the MHZ region.

SUMMARY OF THE INVENTION

It is an object of the present invention to provide a frequency synthesizer with fractional frequency synthesis in which the problem of increased phase noise and the production of secondary lines is solved, and which nonetheless operates with a low circuit outlay in a high frequency range.

A frequency synthesizer according to the present invention has the advantages of a standard synthesizer in which the fractional frequency divider is arranged in the control loop. It thus has the best preconditions for the selection of the frequency range and setting tolerance. It also has the advantages of a synthesizer in which the fractional frequency divider is arranged outside the control loop, and thereby avoids a worsening of the phase noise and the production of secondary lines. Nonetheless, a synthesizer according to the present invention can be constructed very simply and economically, since a standard reference frequency source can be used that lies approximately in the frequency range of the desired output frequency. Only a simple mixer, on which no special demands are made, is additionally required. The inventive arrangement is particularly suited for frequency dividers whose minimum division ratio is very small, since a wide range of variation for the output frequency of the oscillator is possible. The control circuit with multiple integration for the fractional frequency divider is constructed in a known way. Such a control circuit with multi-stage sigma-delta converters is particularly advantageous (for example, see European reference EP 0 214 217).

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawing, in which:

The single FIGURE is a block diagram of the present invention.

DESCRIPTION OF THE PREFERRED EMBODIMENTS

The single FIGURE shows a frequency synthesizer operating according to the principle of fractional frequency synthesis, having a phase-controlled oscillator 1, a phase detector 2, a loop filter 3 arranged in the control line between the phase detector 2 and the oscillator 1, a reference frequency source 4, and a frequency divider 6 arranged between this reference frequency source 4 and one input 5 of the phase detector 2. The frequency divider can be adjusted to whole-number division ratios N, for example between 4 and 16, via a control circuit 7. In this control circuit 7, a desired fractional rational division ratio P, F can be digitally set as a digital value via an adjustment means (not shown). The control signal for setting the frequency divider 6 is produced in the control circuit 7 by addition of the whole-number portion P to a value corresponding to the fractional digit portion F. The value corresponding to the fractional digit portion F is thereby produced in a known way by multiple integration. In dependence on this adjusted fractional division ratio P, F, the division ratio N of the frequency divider is controlled in such a way that a fractional division ratio, corresponding to the fractional digit portion F of this desired division ratio, is simulated by means of periodic changeover.

The output frequency $f_o$ of the oscillator 1 is supplied to a mixer 8, and is mixed down with the output frequency $f_r$ of the reference frequency source 4 to an intermediate frequency $f_i$, which is supplied to the other input 9 of the phase detector 2. The relationship between the output frequency $f_o$, reference frequency $f_r$, and the division factor N of the frequency divider 6 is as follows.

$$f_o = f_r \cdot (1+1/N)$$

In a practical exemplary embodiment, a frequency divider is provided with N=4 to 16, and the output frequency $f_o$ of the oscillator 1 should be adjustable between 288 and 360 MHZ. For this purpose, a reference frequency of 384 MHz is selected, so that the divided reference frequency applied to the input 5 of the phase detector 2 can be adjusted between 24 and 96 MHz, and, via the mixer, the output frequency $f_o$ of the oscillator 1 is also mixed down to the same frequency $f_i$. The input signals of the phase detector thus have the same frequency.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A frequency synthesizer operating according to fractional frequency synthesis, comprising:

a phase-controlled oscillator and a phase detector that controls the oscillator;

a loop filter arranged in a control line between the phase detector and the oscillator;

a reference frequency source;

a frequency divider arranged between the reference frequency source and a first input of the phase detector, the frequency divider being adjustable to whole-number division ratios;

an adjustment device that operates with multiple integration, a whole-number division ratio of the frequency divider being controlled by the adjustment device such that a fractional division ratio corresponding to a desired fractional rational division ratio is simulated;

the phase detector having a second input connected to an output of the oscillator via a mixer, wherein a difference is formed of an output frequency of the oscillator and a reference frequency of the reference frequency source.

2. The frequency synthesizer according to claim 1, wherein the frequency divider is adjustable to a minimum division factor of less than 5.

3. The frequency synthesizer according to claim 1, wherein the frequency divider has a division factor N and wherein the output frequency is equal to the reference frequency multiplied by the term, 1+(1/N), where N is in the range of whole numbers 4 to 16.

4. A frequency synthesizer operating according to fractional frequency synthesis, comprising:

a phase-controlled oscillator and a phase detector that controls the oscillator;

a loop filter arranged in a control line between the phase detector and the oscillator;

a reference frequency source;

a frequency divider arranged between the reference frequency source and a first input of the phase detector, the frequency divider having a division factor N where N is a whole number;

an adjustment device that operates with multiple integration, a whole-number division ratio of the frequency divider being controlled by the adjustment device such that a fractional division ratio corresponding to a desired fractional rational division ratio is simulated;

the phase detector having a second input connected to an output of the oscillator via a mixer, wherein a difference is formed of an output frequency of the oscillator and a reference frequency of the reference frequency source; the frequency divider having a division factor N where N is a whole number the output frequency is equal to the reference frequency multiplied by the term, 1+(1/N), where N is in the range of whole numbers 4 to 16.

5. A frequency synthesizer operating according to fractional frequency synthesis, comprising:

a phase-controlled oscillator and a phase detector that controls the oscillator;

a loop filter arranged in a control line between the phase detector and the oscillator;

a reference frequency source;

a frequency divider arranged between the reference frequency source and a first input of the phase detector, the frequency divider being adjustable to whole-number division ratios and having a minimum division factor of less than 5;

an adjustment device that operates with multiple integration, a whole-number division ratio of the frequency divider being controlled by the adjustment device such that a fractional division ratio corresponding to a desired fractional rational division ratio is simulated;

the phase detector having a second input connected to an output of the oscillator via a mixer, wherein a difference is formed of an output frequency of the oscillator and a reference frequency of the reference frequency source.

* * * * *